United States Patent [19]

Courier de Mere

[11] 4,107,625
[45] Aug. 15, 1978

[54] TRANSISTOR CRYSTAL OSCILLATOR WHICH MAY BE PAIRED FOR GENERATING A BEAT FREQUENCY

[75] Inventor: Henri Courier de Mere, Paris, France

[73] Assignee: Biscosa Societe de Recherche, France

[21] Appl. No.: 771,345

[22] Filed: Feb. 23, 1977

[30] Foreign Application Priority Data

Mar. 15, 1976 [FR] France .................. 76 07382
Mar. 15, 1976 [FR] France .................. 76 07383

[51] Int. Cl.$^2$ .................. H03B 5/36; H03B 21/00
[52] U.S. Cl. .................. 331/37; 58/23 AC; 331/56; 331/116 R; 331/162
[58] Field of Search .................. 331/37, 41, 56, 108 D, 331/116 R, 162; 58/23 R, 23 A, 23 BA, 23 AC

[56] References Cited

U.S. PATENT DOCUMENTS

| 3,432,773 | 3/1969 | Laud et al. .................. 331/116 R |
| 3,539,944 | 11/1970 | Miyake et al. .................. 331/116 R |
| 3,617,923 | 11/1971 | Paradysz et al. .................. 331/143 |
| 4,009,565 | 3/1977 | Courier de Mere .................. 58/50 R |

FOREIGN PATENT DOCUMENTS

| 1,322,297 | 2/1963 | France .................. 331/116 R |
| 2,279,143 | 2/1976 | France .................. 331/117 R |
| 2,360,656 | 7/1975 | Fed. Rep. of Germany .................. 331/37 |

Primary Examiner—Siegfried H. Grimm
Attorney, Agent, or Firm—Pennie & Edmonds

[57] ABSTRACT

An oscillator circuit comprising a transistor, a piezoelectric element and a D.C. source, such as a battery, said transistor being common collector mounted and said piezoelectric element being disposed between the base of said transistor and a first terminal of said D.C. source, characterized in that it is adapted so that the response of said oscillator is ensured by a capacitive impedance comprising exclusively the capacitance of the base-emitter junction of the transistor, the voltage of the source being at most equal to 1.5V.

8 Claims, 3 Drawing Figures

TRANSISTOR CRYSTAL OSCILLATOR WHICH MAY BE PAIRED FOR GENERATING A BEAT FREQUENCY

The invention relates to improvements made to an oscillator circuit comprising a transistor, a piezoelectric element and a D.C. source. It relates more particularly to such a circuit which is of the common collector type, the piezoelectric element being connected between the base of the transistor and a first terminal of the D.C. source. It also relates to the application of such a circuit to time-measuring devices.

An oscillator circuit of this type is already known (French patent 1,322,297) in which the reactance is ensured by a discrete condenser. This oscillator circuit, however, suffers from a disadvantage in that the condenser represents a waste of space for certain applications. Furthermore, the voltage of the supply source and of this oscillator has a relatively high value.

The invention provides then such an oscillator circuit which can operate when the D.C. source supplies a particularly low voltage and which takes up less space.

The invention also provides a particularly simple and economical design for such an oscillator circuit.

The invention also provides an oscillator circuit of the above-mentioned kind which presents an oscillation frequency of stable value.

The oscillator circuit of the invention — in which the transistor is disposed in a circuit of the common collector type and the piezoelectric element, for example a quartz crystal, is connected between the base of said transistor and a first terminal of the D.C. source — is characterised in that it is arranged that the reactance of said oscillator circuit is ensured by a capacitive impedance formed exclusively by the capacitance of the base-emitter junction of said transistor. Furthermore, the voltage of the source is 1.5V at most, preferably less than 1V.

In one embodiment of the invention, the emitter of said transistor is connected directly to the first terminal of the D.C. source through a first resistor, the collector of this transistor is connected directly to the second terminal of the source and, likewise, the base of said transistor is connected directly to the second terminal of the source through a second resistor.

Other aims, arrangements and advantages will become clear from reading the description of certain preferred embodiments in conjunction with the drawings in which.

Figure 1:
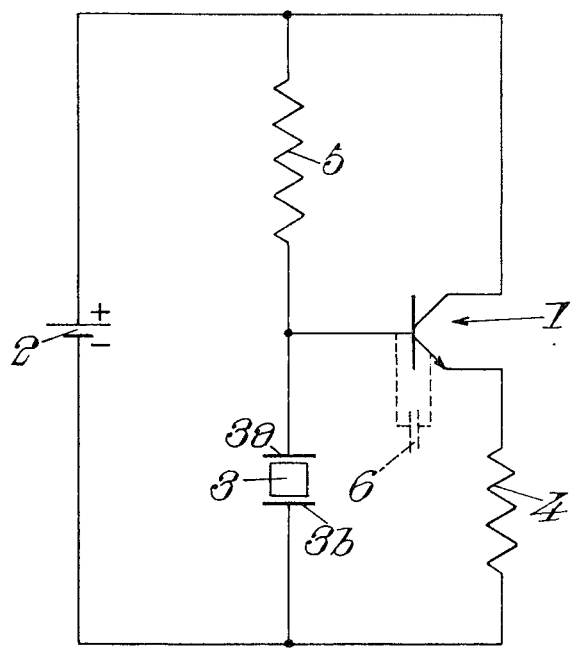
FIGS. 1 and 2 show an oscillator circuit of the invention.

The oscillator circuit shown in FIG. 1 comprises a transistor 1 of NPN type, a D.C. source 2 (in the form of a battery) and a quartz crystal 3.

This oscillator circuit is of the common collector type. The quartz crystal 3 comprises a first terminal 3a which is connected directly to the base of transistor 1 and a second terminal 3b which is connected directly to the first terminal, i.e. the negative pole (−), of source 2. A resistor 4, having a value of 50 KΩ for example, is connected between the emitter of transistor 1 and the negative pole of source 2. The collector of transistor 1 is connected directly to the second terminal, i.e., the positive pole (+), of the source 2. Finally a resistor 5, having a value of 500 KΩ in the example, is connected between the base of transistor 1 and the positive pole.

In this example, the source 2 supplies a voltage of 0.75V and the quartz crystal is of the type whose own resonance is about a Megahertz.

Figure 2:
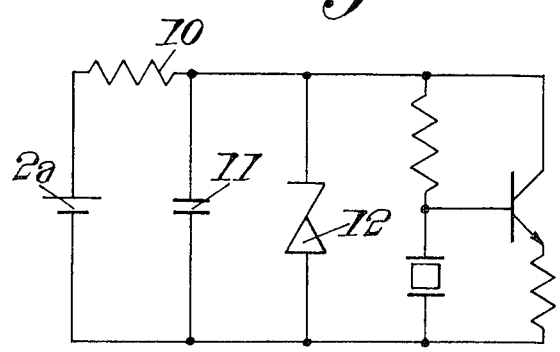

FIG. 2 shows a variation of the circuit of the invention, shown in FIG. 1. In this variation, the electrical supply for the oscillator circuit is provided by a circuit comprising a battery 2a, a resistor 10 whose first terminal is connected to the positive pole of the battery 2a and whose other terminal is connected to the negative pole of battery 2a through a condenser 11. Finally, a Zener diode 12 is disposed parallel to the terminals of the condenser so that its anode is connected to the negative pole of the battery 2a. The rest of the circuit is identical to that described with reference to FIG. 1.

The advantage of the device which has just been described, in relation to that shown in FIG. 1, resides in the fact that it does not necessarily entail choosing a low voltage battery; it is sufficient to select a Zener diode 12 with a sufficiently low Zener voltage. Moreover, the voltage stability is improved; the same goes for the frequency stability. According to a particular embodiment the battery 2a supplies a voltage of 1.5V and the diode presents a Zener voltage of 0.75V; this diode is, in the example, of the type EpiZ of Société THOMSON. Such a diode presents a Zener voltage whose variations are small as a function of the temperature ($2 \times 10^{-3}$V between − 55° C and 100° C).

In operation, the circuits which have just been described with reference to FIGS. 1 and 2, begin to oscillate owing to the reactance supplied by the capacitance of the base-emitter junction of transistor 1. This capacitance has been represented by a condenser 6 shown in broken lines in FIG. 1.

The circuit of the invention is of a particularly simple construction, since it does not comprise, apart from the piezoelectric element 3, any particular oscillating circuit and, especially, no condenser or inductance. Furthermore, because its operation is caused by the capacitance of the base-emitter junction of transistor 1 it needs only a relatively low voltage source, at most equal to 1.5V; in fact, the capacitance of said base-emitter junction increases when the voltage of source 2 decreases. Now, so that the circuit shown can produce an oscillation, said capacitance must exceed a certain threshold value; it is then necessary that source 2, constituted in the example by a battery, present a voltage lower than a threshold. This last arrangement is particularly interesting when the oscillator of the invention is meant for a time-measuring device, such as a wrist watch. In fact in this case, a low voltage battery can be used, i.e. in principle, of space-saving size or (FIG. 2) a Zener diode of low voltage which allows, as we saw earlier on, the frequency stability to be increased.

It was discovered, during experiments conducted within the framework of the invention, that the values of the components, particularly those of resistors 4 and 5, of this circuit could vary within wide limits without the operation of the circuit being affected. In other words, the values of the components of this circuit are not critical and its realization is facilitated.

Finally, the circuit shown can be in the form of an integrated circuit, particularly in the bipolar technique, the resistors in this circuit not having too high a value.

Of course, the circuit which has just been described can be modified in various ways without going beyond the scope of the invention. For example transistor 1 can be of the PNP type. Also as an example, the quartz crystal 3 can be replaced by any other piezoelectric element, particularly by a ceramic. Although in the example described the resonance frequency of the quartz used is of the order of 1 Megahertz, the invention is not limited either to this frequency; a piezoelectric element can be used whose resonance frequency is relatively low.

The oscillator of the invention can be adapted for numerous applications. In particuliar this oscillator can be used whenever an oscillation frequency of a particularly stable value is desired, and especially in a time-measuring device such as will now be described with reference to FIG. 3.

Figure 3:
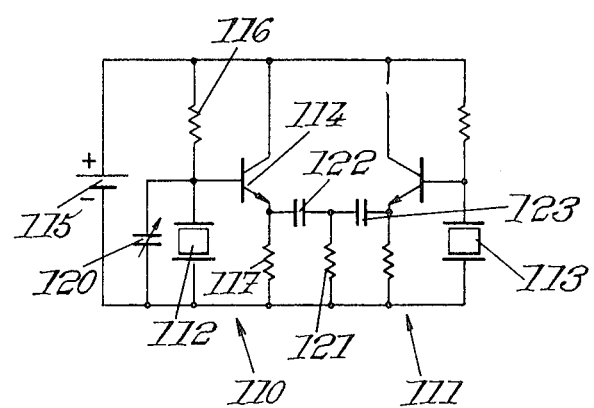
FIG. 3 shows a beat type time-measuring device which comprises two oscillators according to the invention.

The time-measuring device shown in FIG. 3 has two oscillators 110 and 111 whose frequencies F and F' respectively, are closely related and adapted to produce a beat signal of frequency F – F'. For this a load resistor 121 is provided which collects the output signals of oscillators 110 and 111 through condensers, respectively 122 and 123. These condensers are connected to a first terminal of resistor 121 whose second terminal is connected to the negative pole of source 115.

Each of said oscillator circuits 110 or 111 is of the type having, as for FIGS. 1 and 2 (oscillator 110), a transistor 114 mounted with common collector; the collector of this transistor is connected directly to the positive pole of a D.C. source 115 (low voltage battery), and the piezoelectric element 112 is disposed between the base of the transistor and the negative pole of source 115. In addition, a resistor 116 is disposed between the base of transistor 114 and the positive pole of source 115. A resistor 117 is connected directly between the emitter of transistor 114 and the negative pole of source 115.

In the example, resistors 116 and 117 are respectively 500 and 50 KΩ.

Oscillator circuit 111 is identical to oscillator circuit 110. However, so that the frequencies of these two circuits present a difference, to the terminals of the piezoelectric element 112 of oscillator 110 is connected a condenser 120 which, in the embodiment shown, has an adjustable capacitance to permit adjustment of the frequency F – F' of the generator of the invention.

The operation of each oscillator circuit (110, 111) is similar to that of the oscillators shown in FIGS. 1 and 2.

The generator which has just been described with reference to FIG. 3 is particularly interesting when piezoelectric elements 112 and 113 are used which have a resonance frequency of about 1 MHz or more. In fact, in this case, these piezoelectric elements 112 and 113 can be quartz crystals or ceramic elements of low cost and reduced volume. Thus, in a particular embodiment, two quartz crystals 112 and 113 are used which are cut according to the AT cut whose resonant frequency is 4 MHz; in this case, these crystals are in the form of chips with a diameter of 5mm and a thickness of 0.1mm. In this particular embodiment, the capacitance of condenser 120 is chosen such that the frequency F – F' of the beats is equal to 32,768 Hz. Therefore a frequency divider circuit of the current type can be used.

It will moreover be noticed that the AT cut of the quartz gives a substantially stabler resonant frequency, this type of cut being usually used in time-keeping applications.

It will also be noted that up to now quartz crystals having a high resonant frequency of the order of 1 MHz have not been used for wrist watches and small clocks for, starting with such a high frequency, the consumption of electrcal energy by the frequency divider would be too high. In fact it is necessary to obtain a frequency of 1 Hz and the current drained by the divider circuit is proportional to the dividing ratio. On the contrary, with the circuit of the invention, the divider circuit presents a dividing ratio which is not prohibitive. Moreover, the dividing ratio can be lowered even more if the frequency F – F' of the beats is chosen at a particularly low value.

As it will be obvious and as it results moreover from what has gone before, the invention is not limited to the embodiments and modes of application considered; on the contrary it covers all variations.

I claim:

1. An oscillator circuit comprising a transistor, a piezoelectric element and a source of direct current, and wherein said transistor is connected in common collector configuration and said piezoelectric element is connected between the base of said transistor and a first terminal of said source, said oscillator circuit being characterized by a capacitive inpedance which sustains oscillation consisting exclusively of the capacitance of the base-emitter junction of said transistor, and the voltage of said source being no greater than 1.5 volts.

2. An oscillator circuit according to claim 1, characterised in that the emitter of said transistor is connected directly to said first terminal of the source through a first resistor, the collector of said transistor is connected to the second terminal of the source and the base of said transistor is connected directly to the second terminal of the source through a second resistor.

3. An oscillator circuit according to claim 1, characterised in that the piezoelectric element comprises a quartz crystal element.

4. An oscillator circuit according to claim 1, characterised in that said piezoelectric element comprises a ceramic element.

5. An oscillator circuit according to claim 1, characterised in that the voltage of the source is less than 1V.

6. An oscillator circuit according to claim 1, characterized in that the source comprises a battery, and a Zener diode connected to said first and second terminals of said battery, said Zener diode regulating the voltage to a voltage less than the voltage of the battery.

7. A time-measuring device comprising a signal generator of a definite frequency, characterised in that it comprises two oscillators according to claim 1 and capable of generating frequency signals F and F' of distinct values whose difference is a function of said definite frequency and means for adding the signals supplied by said oscillators to produce a beat signal whose frequency is equal to said definite frequency.

8. A device according to claim 7, characterised in that said frequencies F and F' are at least equal to 500 KHz.

* * * * *